(12) United States Patent
Abbott

(10) Patent No.: US 6,239,440 B1
(45) Date of Patent: *May 29, 2001

(54) ARC CHAMBER FOR AN ION IMPLANTATION SYSTEM

(75) Inventor: Richard C. Abbott, Gardner, MA (US)

(73) Assignee: Thermoceramix, L.L.C., Boston, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/290,471

(22) Filed: Apr. 12, 1999

Related U.S. Application Data

(63) Continuation of application No. 09/002,748, filed on Jan. 5, 1998, which is a continuation of application No. PCT/US97/17938, filed on Oct. 3, 1997, which is a continuation-in-part of application No. 08/725,830, filed on Oct. 7, 1996, now Pat. No. 5,805,051, which is a continuation-in-part of application No. 08/622,849, filed on Mar. 27, 1996, now abandoned.

(51) Int. Cl.[7] .............. H01J 37/08; H01J 37/317
(52) U.S. Cl. .............. 250/423 R; 250/492.21; 315/111.81
(58) Field of Search .............. 250/492.21, 423 R; 315/111.81

(56) References Cited

U.S. PATENT DOCUMENTS

| | | | |
|---|---|---|---|
| 3,960,605 | 6/1976 | Beck et al. | 148/1.5 |
| 4,383,177 | 5/1983 | Keller et al. | 250/423 R |
| 4,385,946 | 5/1983 | Finegan et al. | 148/175 |
| 4,658,143 | 4/1987 | Tokiguchi et al. | 250/423 R |
| 4,670,685 | 6/1987 | Clark, Jr. et al. | 313/230 |
| 4,751,393 | 6/1988 | Corey, Jr. et al. | 250/492 |
| 4,822,752 | 4/1989 | Sugahara et al. | 437/174 |
| 4,851,255 | 7/1989 | Lagendijk et al. | 427/38 |
| 4,857,480 | 8/1989 | Plante | 437/168 |
| 4,946,706 | 8/1990 | Fukuda | 427/35 |
| 4,980,562 | 12/1990 | Berrian et al. | 250/492.2 |
| 5,086,256 | 2/1992 | Tokiguchi et al. | 315/111.81 |
| 5,089,746 | 2/1992 | Rosenblum et al. | 315/111.81 |
| 5,134,299 | 7/1992 | Denholm | 250/492.2 |
| 5,136,171 | 8/1992 | Leung et al. | 250/492.2 |
| 5,162,699 | 11/1992 | Tokoro et al. | 315/111.81 |
| 5,262,652 | 11/1993 | Bright et al. | 250/492.2 |
| 5,308,989 | 5/1994 | Brubaker | 250/441.11 |
| 5,354,381 | 10/1994 | Sheng | 118/723 E |
| 5,354,698 | 10/1994 | Cathey, Jr. | 437/20 |
| 5,373,164 | 12/1994 | Beneviste | 250/492.21 |
| 5,420,415 | 5/1995 | Trueira | 250/492.21 |
| 5,432,352 | 7/1995 | Van Bavel | 250/492.21 |
| 5,563,418 | 10/1996 | Leung | 250/492.21 |
| 5,640,020 | 6/1997 | Murakoshi et al. | 250/492.21 |
| 5,857,889 | 1/1999 | Abbott | 445/49 |
| 5,914,494 | * 6/1999 | Abbott | 250/492.21 |

OTHER PUBLICATIONS

Wolf, Bernhard, *Handbook of Ion Sources*, Chapter 2, Characterization of Ion Sources Section 2 (pp. 37–46), Section 3 (pp. 47–60), Sections 4 (pp. 61–67) and Section 6 (pp. 93–100) 1995.

Hot Press Furnace Brochure, Advanced Vacuum Systems 1995.

* cited by examiner

*Primary Examiner*—Jack Berman
(74) *Attorney, Agent, or Firm*—Hamilton, Brook, Smith & Reynolds, P.C.

(57) ABSTRACT

The present invention relates to the fabrication of materials and structures having selected mechanical, thermal and electrical properties. More particularly, the invention relates to the use of these materials and structures in ion implantation systems. Structures comprising boron material provide components for use in implanters including arc chambers with which a beam of ions is generated for implantation into a target such as a semiconductor wafer.

16 Claims, 18 Drawing Sheets

ARC CHAMBER FOR AN ION IMPLANTATION SYSTEM

RELATED APPLICATIONS

This application is a continuation application of U.S. Ser. No. 09/002,748 filed on Jan. 5, 1998 which is a continuation application of International Application No. PCT/US97/17938 filed on Oct. 3, 1997 which is a continuation-in-part application of U.S. Ser. No. 08/725,830 filed Oct. 7, 1996, now U.S. Pat. No. 5,805,051 which is a continuation-in-part of U.S. Ser. No. 08/622,849 filed on Mar. 27, 1996, abandoned the teachings of the above applications being incorporated herein by reference in their entirety.

BACKGROUND OF THE INVENTION

The present invention relates to methods for fabricating materials and structures having mechanical, thermal and electrical properties suitable for use in a wide variety of applications.

Materials fabricated from powder have in the past been fabricated using a sintering process but do not have a sufficient density to provide a product having sufficient mechanical strength or thermal stability.

For example, boron has a wide variety of uses, but it is a difficult material to form in a desired geometry and is also difficult to machine. Arsenic, phosphorus, antimony and boron are all used as dopants in the fabrication of semiconductor devices. These materials are selectively ionized and implanted using an ion implantation system. These systems have an ion source that is used to generate a beam of ionized particles which are directed onto a target such as a semiconductor wafer. These systems are complex and expensive to fabricate, operate and maintain. A particular problem in the use of these ion implanters is the level of impurities generated during use which increases maintenance, increases defect density in the materials produced and reduces production yield in the manufacture of devices.

The housing for the ion source in an implanter is often referred to as an arc chamber. Arc chambers have usually been made of graphite, molybdenum or tungsten. These materials contribute to the contamination of the beam, and consequently, they contaminate the final product.

In one type of arc chamber electrons are emitted by a cathode, usually by thermionic emission, and accelerated to an anode. Some of these electrons have collisions with gas atoms or molecules and ionize them. Secondary electrons from these collisions can be accelerated toward the anode to energies depending on the potential distribution and the starting point of the electron. Ions can be extracted through the anode, perpendicular to it, or through the cathode area depending upon the type of source.

To increase the ionization efficiency of the electrons in electron bombardment ion sources, several modifications have been introduced in existing systems. An additional small magnetic field confines electrons inside the anode and lets them spiral along the magnetic field lines, multiplying on their way to the anode and increasing the ionization efficiency of the ion source. By using a cylindrical anode and a reflector electrode, the electron path is further enlarged. Many mass separator ion sources are this type, such as the Nier, Bernas, Nielsen, Freeman, Cusp and other sources.

The Bernas ion source, for example, has a rectangular or cylindrical arc chamber positioned in an external magnetic field. The source can contain a single-turn helical filament (cathode) at one side of the arc chamber and a reflector at the other end. Electrons from the cathode are confined inside the anode cylinder by the magnetic field and can oscillate between the filament and the reflector resulting in a high ionization efficiency. Ions are extracted perpendicular to the anode axis through a slit of about 2 mm width and about 40 mm length. However, the dimensions can vary, depending on the specific design.

A continuing need exists for improvements in the field of materials fabrication to provide structures having desired mechanical, thermal and electrical properties. In particular, there is a need for improvements in ion implantation systems used for the fabrication of semiconductor devices.

SUMMARY OF THE INVENTION

The present invention relates to devices and methods of fabricating components for use in ion implantation systems. More particularly, the invention relates to the fabrication of boron arc chambers and other boron components for ion implantation systems. With the use of boron components in ion implantation systems a number of advantages are realized, including a reduction in contaminants due to the use of boron instead of other materials such as graphite, molybdenum or tungsten; the enhancement of beam current that can be accommodated due to the lower level of contaminants; the lighter weight of these components and the ability to retrofit them onto existing systems as well as their use in new systems, and the ability to use these components with the electrical system (e.g. as electrodes) and as a source of boron particles for ionization.

The refractory metals are problematic for the ion source because they are heavy, difficult to fabricate, and highly reactive with boron trifluoride, a gas used in many systems to provide a source of boron for ionization.

Tungsten, for example, is the current preferred material for the Bernas ion source but is far from ideal. It is one of the heaviest of all engineering materials having a density of 19.3 gm/cc, is difficult and expensive to machine, and reacts with boron trifluoride to form another gas, tungsten hexafluoride. The chemical reaction between fluorine and tungsten not only erodes the interior of the arc chamber but also acts as a material transport mechanism for depositing tungsten metal at other regions of the chamber. This effect shortens the chamber lifetime and considerably alters its interior geometry. Additionally, tungsten hexafluoride formation acts to pump unwanted tungsten ions into the boron beam current, some of which invariably ends up in the target, which is typically a single crystal silicon wafer or silicon-on-insulator (SOI) structure used for the manufacture of integrated circuits.

Boron is very light, having a density of 2.46 gm/cc (about 13% the weight of tungsten) and therefore, is less demanding on mounting fixtures and is easier to handle. It is also very hard and strong, even at the elevated operating temperatures of an arc chamber. It is more durable than graphite and tungsten, which is prone to creep (permanent displacement under an applied load). A boron arc chamber enhances the source beam current by reaction with free fluorine ions in applications involving the use of boron trifluoride as a source for boron ions.

Solid boron has not been utilized in semiconductor processing systems because it is not a conventional engineering material. There are currently no known manufacturers of dense boron products, mainly because specialized materials techniques are required to form this type of boron.

Structures made from boron for use in the fabrication of implanter components can be made using several distinct processes. A preferred embodiment of a method for making such boron structures includes providing a mold or die having the desired shape for the part to be fabricated, positioning a boron material such as an amorphous boron powder into the mold, treating the boron powder under selected conditions of temperature and pressure to crystallize the powder into a more crystalline state to form a solid unitary boron structure, removing the structure from the mold and machining the structure as necessary. In many applications it is desirable to produce a structure having a polycrystalline lattice with an average crystal size in the range of 1 to 10 microns. In some applications it is desirable to form a structure having a crystal size in excess of ten microns, including single crystal material. In some applications with lower tolerance requirements there may remain a large population of crystals with diameters of less than 1 micron, typically in the range of 0.5–1 micron.

It is also preferred that the density of the material produced be at least 50% of its maximum (theoretical) density, and preferably in the range of 80–100% in order to increase the mechanical strength and resistance to erosion. A preferred embodiment employs boron having a high purity level having an atomic percentage of elemental boron of at least 95%, and preferably of at least 99.99% or greater.

The fabrication process can be pressure sintering methods such as uniaxial hot pressing and hot isostatic pressing, or a casting method, a single crystal growth method, by deposition from the vapor or liquid phase, or by spray forming. The specific technique employed for a given workpart will depend upon the requirements for purity, density, and geometry as well as the mechanical, electrical, optical and/or chemical characteristics desired.

For certain ion sources, a preferred embodiment of the invention utilizes boron material as a source of boron to be ionized. At sufficiently low pressure and high temperature boron sublimes at a rate sufficient to produce a flow of gaseous boron suitable to generate an ion beam for implantation under electron bombardment.

In another preferred embodiment, boron is used as a filament to generate electrons by thermionic emission which are then accelerated by an electric field to bombard the boron within the arc chamber to generate the ionized beam. A magnetic field is used to confine ions within the chamber until they are extracted through the exit aperture of the chamber to form the ion beam. When highly pure boron is heated to a sufficient temperature, it becomes highly conductive. Many arc chambers, for example, operate at temperatures at which boron is conductive and can thus employ boron as electrically conductive components. Alternatively, doped boron structures can be used which are conductive at lower temperatures, including room temperature. Boron is also highly transmissive in the infrared region (e.g. 1–8 microns wavelength) of the electromagnetic spectrum and can be used as an optical window or lens. A boron window or lens can thus be used with an infrared sensitive camera such as a charge coupled device to monitor thermal processes or other infrared imaging applications such as infrared radar.

Other components within the implanter that are exposed to the ion beam, or which are likely to contaminate the beam, can optionally also be made of boron. These can include, without limitation, the extraction electrode or grid, components of the beam analyzer such as the beam trap target, beam deflectors, and components of the implantation chamber including trays for holding wafers, electrostatic clamps, and robot arms to control movement of objects within the implantation chamber.

The processes described herein can also be used in the manufacture of dense boron coatings, sputtering targets, for the preparation of boron coatings for diffusion into other substrates including semiconductors, and as diffusion furnace components.

DETAILED DESCRIPTION OF THE INVENTION

Figure 1A:
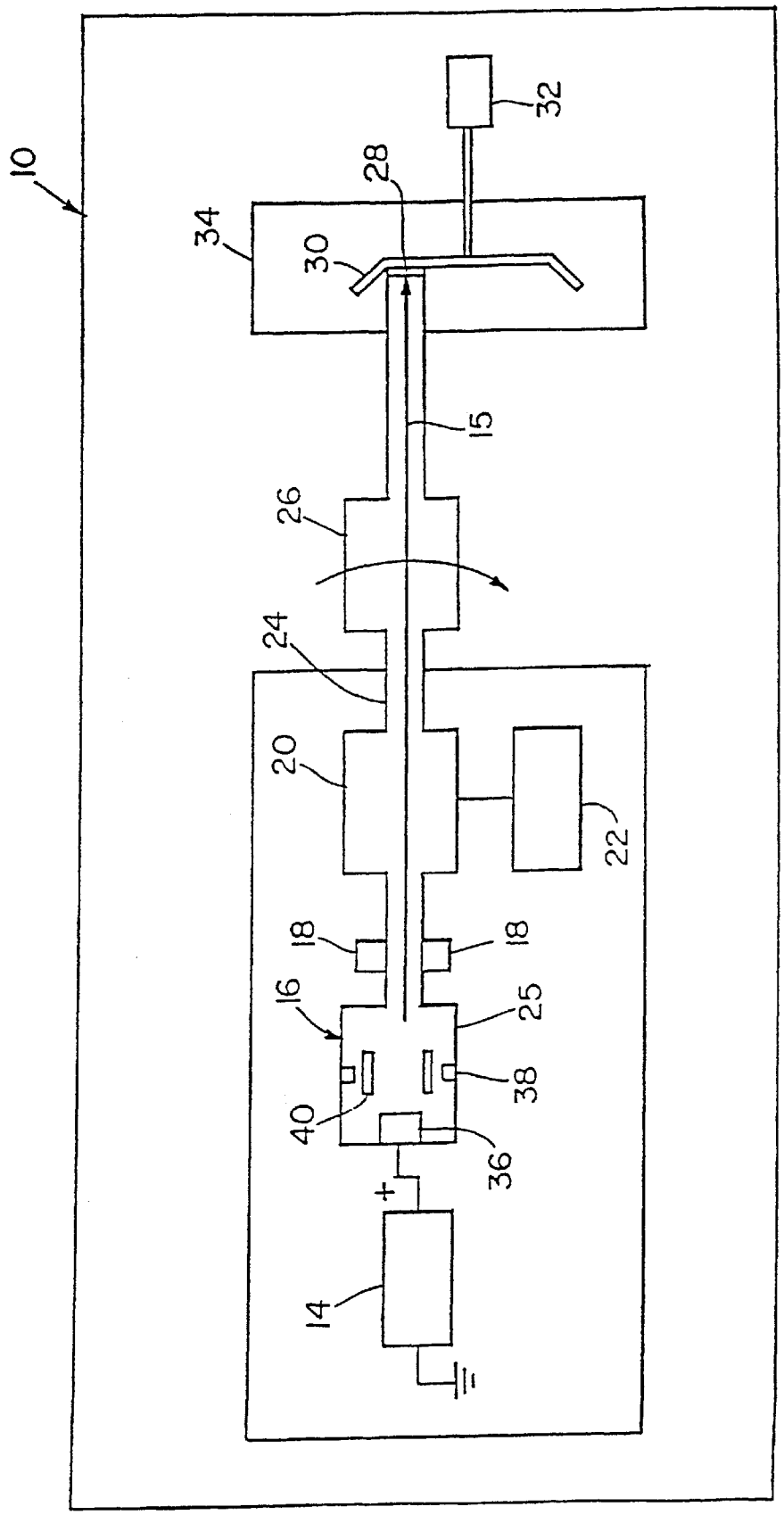
FIG. 1A is a schematic diagram of an ion implanter embodying the invention.

A preferred embodiment of the invention is illustrated generally in the ion implantation 10 system of FIG. 1A. The system 10 typically includes an ion source 16, a power supply 14, an extracting electrode or grid 18, a magnetic beam analyzer 20 and a controller 22 which are positioned within an inner housing 12. Ions are generated at the source 16, extracted from the source 16 with electrode 18 and conveyed along the ion beam path 15 within the beam housing 24 into the implantation chamber 34. The beam analyzer 20 selectively separates components of the beam exiting from the source 16 so that only ions of the desired mass are directed towards the ion implant chamber 34.

The source 16 includes an arc chamber housing 25 constructed from a crystalline boron material. There are several types of sources having different configurations of the components, however, these components can include an anode, a cathode, a third electrode or filament, various ports to introduce materials into the arc chamber 25 to be ionized, and an exit aperture through which ions are extracted from the chamber 25. The boron material used in the chamber will vary depending upon the application, but the material will usually have a uniform density of either a polycrystalline material or a single crystal material.

Other components of the implanter can include a beam controller 26 that can be used to selectively deflect the beam so that the beam can be scanned across a target 28. The implantation chamber 34 includes a support 30 for one or more targets or wafers mounted within the chamber 34 and a drive mechanism to control movement of the support 30 relative to the implantation chamber housing 34. The system can be used, for example in the fabrication of many size wafers from 50 mm up to 300 mm or higher. A robot arm can be used to move targets within the chamber and/or insert or remove targets from the chamber. As described in greater detail, many components of processing systems can be made using boron material as well as the arc chamber in order to lower impurity levels and improve system durability and performance.

Figure 1B:
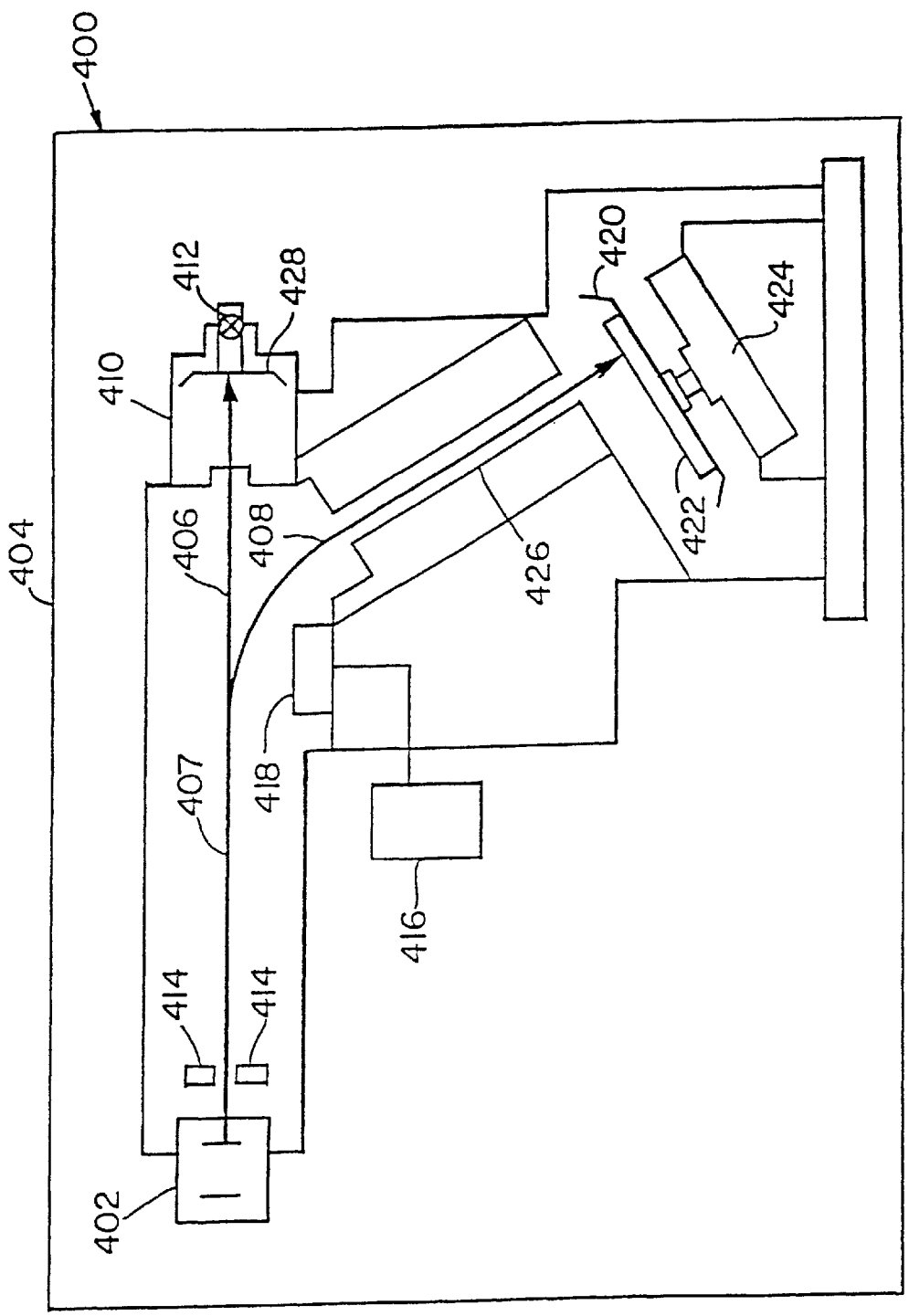
FIG. 1B illustrates an implantation system providing ion beam trap.

FIG. 1B illustrates another preferred embodiment of an implantation system providing beam trap. Similar to the system in FIG. 1A, the implantation system 400 includes a ion beam source 402 which generates ion beam 407 extracted with the help of extracting electrodes 414 and passes the beam through an enclosed path 404. The beam is filtered by a magnetic beam analyzer which guides a portion 408 of the source beam having appropriate mass. The portion 406 having heavier mass is unable to make the turn into the target guide 426 and is directed to a trap 410. The trap includes a beam target or collector 428 and a valve 412 to allow removal of trap debris. The magnetic analyzer 418 is controlled by a mass controller 416. The desired ion beam 408 is guided to strike a target 422 which can be mounted on a rotatable disk 420 driven by a motor 424.

Figure 2A:
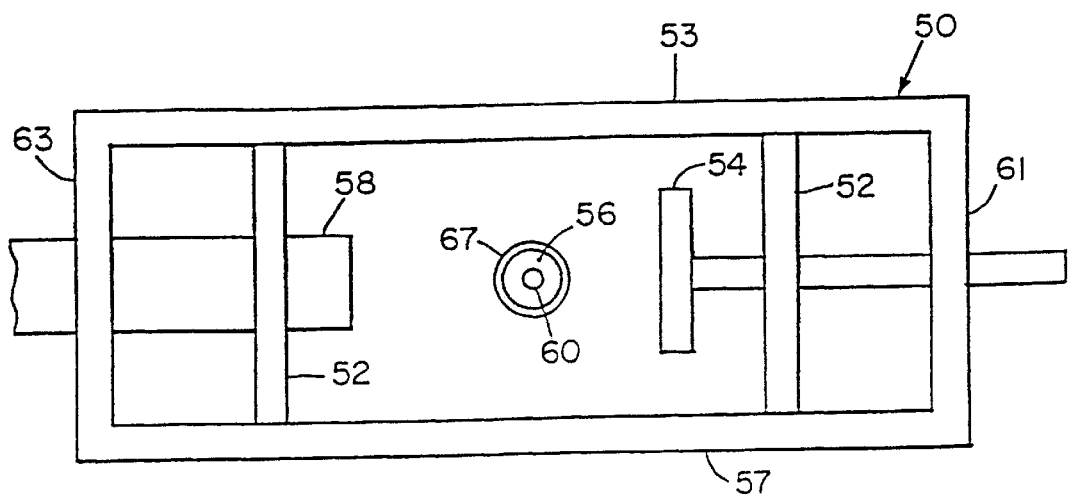
FIGS. 2A and 2B are cross-sectional top and side views, respectively, of an arc chamber in accordance with the invention.
Figure 2B:
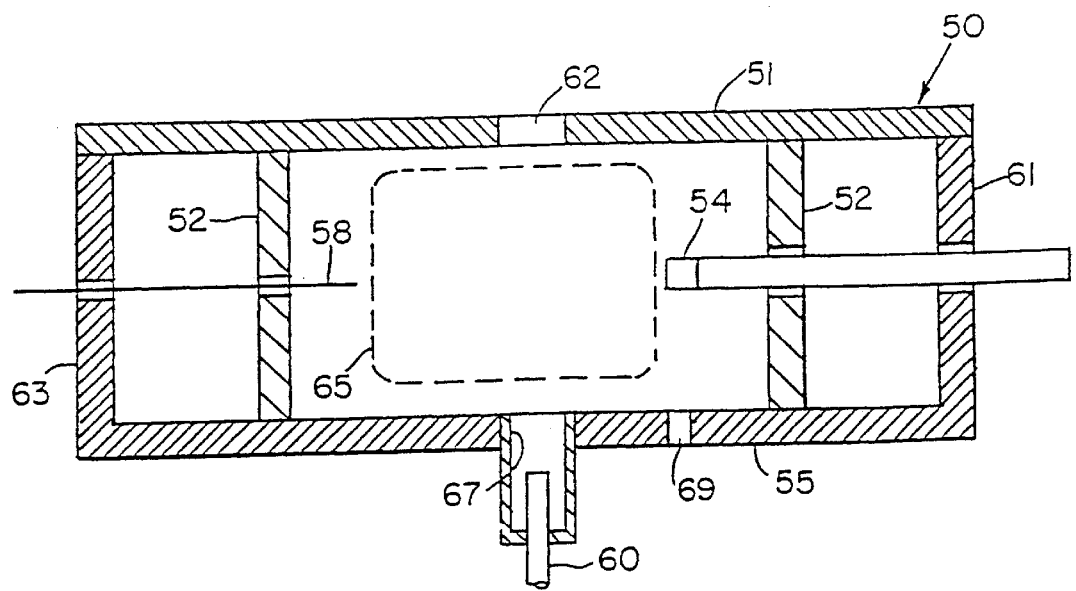

A preferred embodiment of an arc chamber of an ion source is of Bernas type and an example is illustrated in FIGS. 2A and 2B, respectively. The housing 50 comprises a boron material made in accordance with the methods defined in greater detail below. The boron material is preferably a polycrystalline material with the average grain size being in the range of 1 to 10 microns. The density of the material is at least 50% of the maximum theoretical density (TD), and preferably greater than 60% TD for machining purposes. The boron housing uses boron having an atomic percentage of at least 95% elemental boron and preferably at least 99.99%.

Other preferred embodiments of the housing material can include single crystal boron, or alternatively, certain components can be made with boron compounds such as silicon hexaboride, tungsten boride, boron nitride or titanium diboride which are compatible for use in combination with the solid boron structures described herein. The inner surfaces of the chamber can also be coated with pure dense boron or these compound materials, with the specific type of material chosen being dependent upon the type of ion source, the desired insulating characteristics and the gases used within the chamber.

The components within the chamber can either be the standard materials, or more preferably, these can also be formed from the same boron material as the housing 50. These can include the shields 52, the cathode which serves as a source of electrons, an anode 67 and the repeller 54.

Figure 2C:
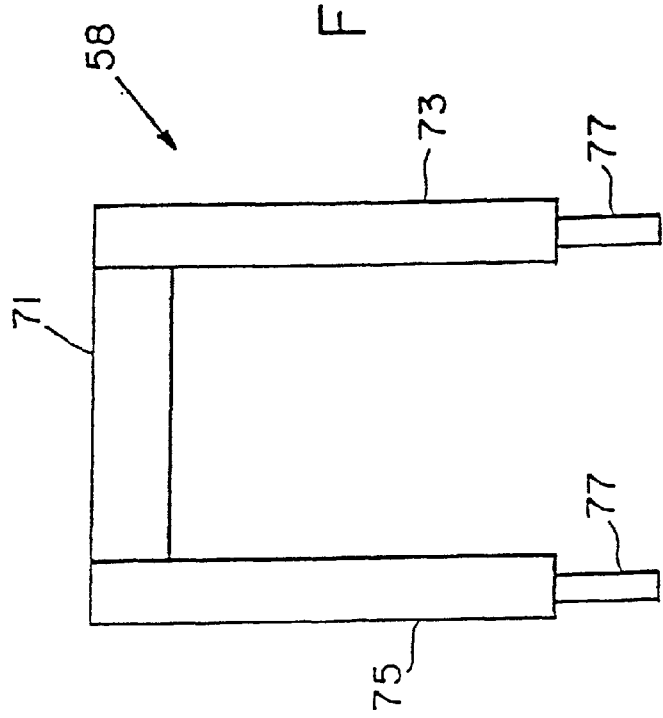
FIGS. 2C, 2D, 2E are detailed front, bottom and side views of a boron filament in accordance with the invention.
Figure 2D:
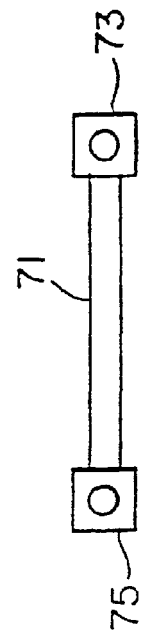
Figure 2E:
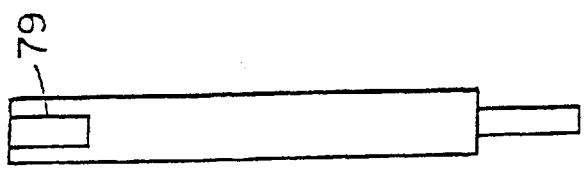

The cathode filament 58 serves as a source of electrons that bombards a boron material entering through the port 56 in the bottom wall 55 of the chamber 50 to form boron ions. FIGS. 2C, 2D and 2E illustrate front, bottom and side views of a boron filament 58. the filament 58 can include three elements, two posts 73, 75 and cross member 71. Member 71 fits within a groove 79 in one end of both posts, at the opposite end of both posts 73, 75 are connectors 77 that extend through the wall of the chamber and connect to pin connectors to attach the filament 58 to a power source.

A portion of the chamber serves as the ion source anode 67. The cathode 58 can be made of Ta or W. The gas flow is small so the source will operate in a vacuum environment within the arc chamber of about $5 \times 10^{-4}$ torr. Alternatively, as described in greater detail below, the filament, the ion source and/or the cathode can also be boron material.

The top wall 51 of the chamber 50 has an aperture 62 or rectangular slit through which ions within a containment region 65 within the chamber are drawn.

The filament 58 generates electrons which oscillate between the filament and the reflector. The electrons impact particles containing boron which have been directed into the electron path to produce boron ions. The ions are extracted perpendicular to the anode axis through the aperture 62. Additional ports 69 can be used to introduce gases into the chamber. The boron source 60 can either be a standard gas or a boron material that is heated above its sublimation temperature to produce a sufficient flow of boron particles.

The top 51, bottom 55, sides 53, 57, plates 52, and end plates can be made separately as described hereinafter and bonded at the edges, or alternatively, they can be mounted using an external fixture, or a large number of plates and rings can be made separately and pressed together. Alternatively, chamber components can be formed to near net shape without the need for extensive further machining.

In the multicusp ion source, the primary ionizing electrons are normally emitted from tungsten-filament cathodes. The source chamber walls or a ring form the anode for the discharge. The surface magnetic field generated by rows of permanent magnets, typically of samarium-cobalt or neodymium-iron, can confine the primary ionizing electrons very efficiently. As a result, the arc and gas efficiencies of these sources are high.

Figure 3A:
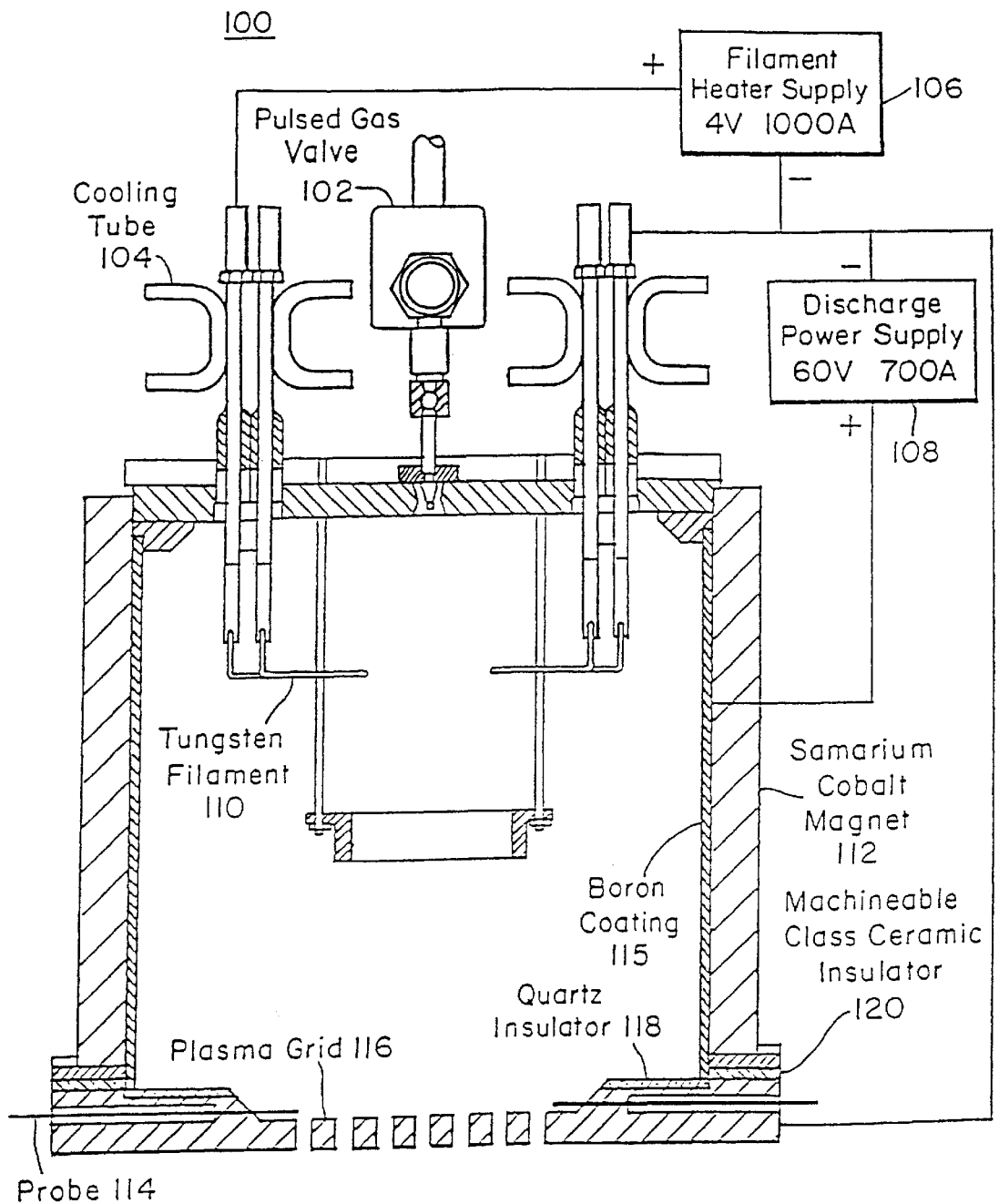
FIG. 3A is a cross-sectional view of a multicusp ion source in accordance with the invention.
Figure 3C:
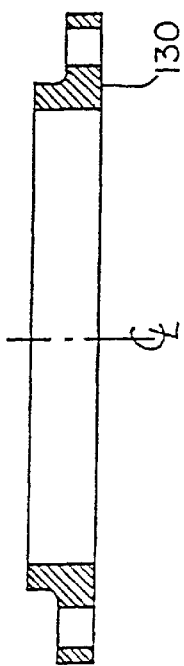
FIGS. 3B and 3C are top and cross-sectional views of an anode ring for a multicusp ion source embodying the inventions.

The multicusp ion source is relatively simple to operate. There are four main components in the source: the filaments (cathode), the chamber, an anode ring, and the first, or plasma, electrode. A schematic diagram of the multicusp source is shown in FIG. 3A. The source chamber can be rectangular, square or circular in cross section and is formed with a boron material. The permanent magnets can be arranged in rows parallel to the beam axis. Alternatively, they can be arranged in the form of rings perpendicular to the beam axis. The back plate also contains rows of the same permanent magnets. Grooves are generally milled on the external wall so that the magnets are mounted within approximately 3 mm from the vacuum. These magnets generate multicusp magnetic fields for primary electron as well as for plasma confinement.

The open end of the source chamber is closed by a set of extraction electrodes which can be made with a conductive boron material. The source can be operated with the first electrode electrically floating or connected to the negative terminal of the cathode. The background gas is introduced into the source chamber through a needle or a pulsed valve. The plasma is produced by primary ionizing electrons emitted from one or more boron or tungsten filaments, which are normally biased negatively with respect to the chamber wall or the anode ring. These filaments are located in the field-free region of the ion source chamber and they are mounted on molybdenum holders. The plasma density in the source, and, therefore, the extracted beam current, depends on the magnet geometries, the discharge voltage and current, the biasing voltage on the first extraction electrode, and the length of the source chamber. The source chamber is normally pumped down to about $10^{-6}$ to $10^{-7}$ torr before gases are introduced for beam generation.

Figure 3B:
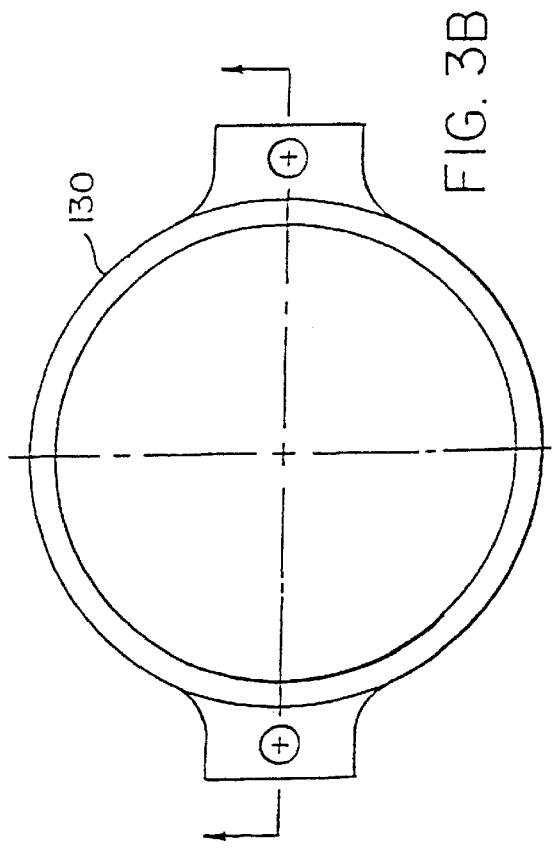

The multicusp source for ion implantation and for surface modification purposes, beams of $B^+$, $P^+$, $As^+$, and $N^+$ ions have been extracted from multicusp ion sources. By operating the source at higher discharge voltages, ions with multiply charged states have been generated. FIGS. 3A and 3B illustrate top and side cross-sectional views, respectively, of a boron anode ring for a multicusp ion source. As the anode ring operates at a temperature of about 600° C., the anode is conductive.

Freeman developed another type of source by putting the cathode of a Nier type mass separator ion source inside the hollow anode, as in a magnetron, but left the magnetic field low. The performance of the Freeman ion source has made it successful for ion implantation and industrial application, especially for semiconductor implantation.

Figure 4:
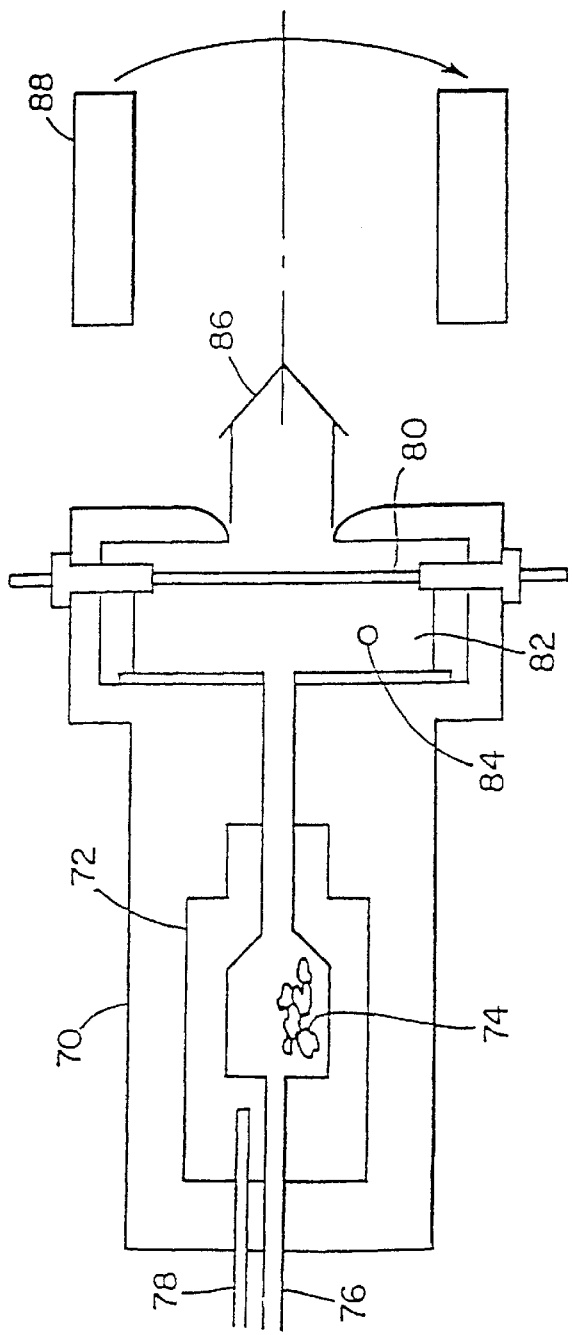
FIG. 4 is a schematic view of a Freeman source in accordance with the invention.

The Freeman type ion source as shown in FIG. 4 has a similar design to a magnetron, but it uses just a low external magnetic field of about 100 G. The arc current is 1 to 3 A and the arc voltage is between 40 and 70 V. A rigid cathode rod 80, usually 2 mm in diameter and made of tantalum or tungsten, is heated with about 130 A and a few volts to the right temperature. The cathode 80, as well as the chamber 82 can be made of boron. The axial position of the cathode in the Freeman ion source shows several advantages including:

1. The inherent magnetic field of the cathode forces the primary electrons to move around the cathode, concentrating the electron density in this area.
2. The high electron density next to the extraction slit produces a high ion density in this area, and, thus, a high ion beam current.
3. The straight-filament rod fixes the plasma parallel to the magnetic field lines and the extraction aperture, which is the reason for the excellent beam quality of Freeman ion sources.
4. The low magnetic field does not force instabilities like the high field in a magnetron.

The lifetime of the source is dependent upon the type of gas used or corrosion rate of the boron or other components in the source. Changing the polarity of the filament after some time of operation improves cathode lifetime. Heating by AC has the same effect but increases plasma instabilities and the energy spread of the extracted ions.

The Freeman ion source is especially designed to deliver ion beams from nongaseous materials. There are many versions with ovens for various temperatures and for the application of chemical compounds and in situ chemical synthesis of the required material. With chemical compounds, corrosion problems occur not only at the cathode, but also at the anode and with the oven.

Ion currents of several milliamps can be produced for most elements and more than 20 Ma for a few elements like arsenic and phosphorus under favorable circumstances and using large extraction areas. The extraction slit is usually about 2 mm wide and about 40 mm long. Larger slits are possible, such as 90 mm, but there are some disadvantages because the current density is not uniform along the long slit due to the bigger voltage drop along the cathode. The anode and the magnetic field can be adjusted, however, to overcome this problem.

The ion current density is controlled by the arc current, which is controlled by the filament, the gas pressure, and the magnetic field. The ion source is mounted inside the vacuum chamber. The feed-throughs can be mounted on a base flange perpendicular to the source axis. The extraction slit is usually 40×2 mm but designs up to 100×5 mm have been realized. This type of source can use a W, Ta or boron filament, 1.5–2.5 mm Ø, alumina or boron nitride insulators; and operates in a vacuum at less than $7.5 \times 10^{-6}$ torr.

Figure 5A:
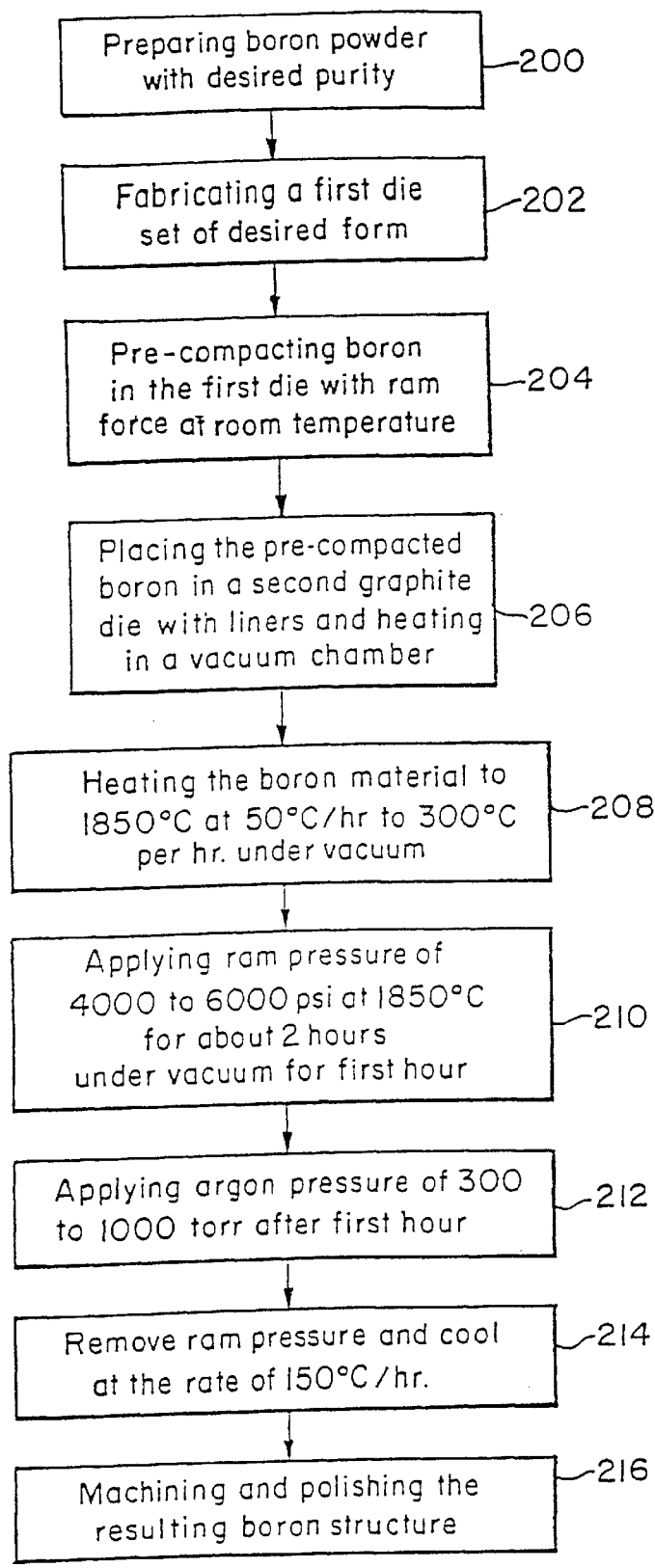
FIG. 5A is a process flow diagram illustrating a hot pressing technique for fabricating a boron structure in accordance with the invention.
Figure 5B:
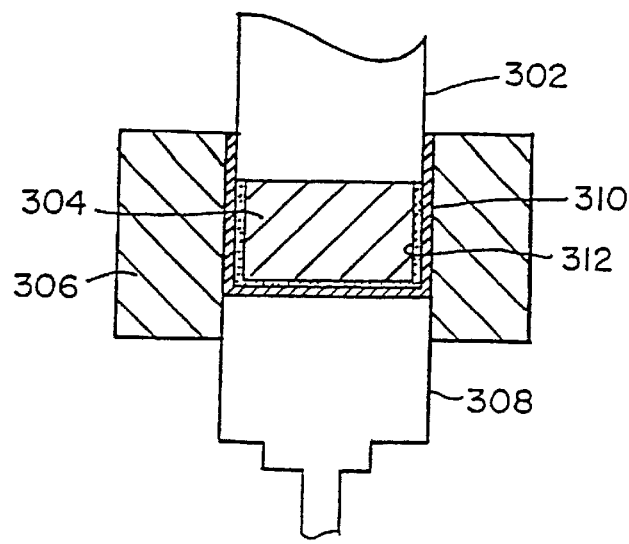
FIG. 5B graphically illustrates a pre-compacting process of boron powder.

FIG. 5A describes the process flow sequence of a preferred hot pressing method. The process begins at 200 by preparing boron of 99.9% purity in dry powder form. FIG. 5B illustrates the apparatus for the pre-compacting sequence. A first die or mold 306 of desired form is fabricated at 202 to contain the boron powder. The dry boron powder is then pre-compacted at 204 in the first die by applying ram force with a punch 302 at room temperature. The compacted boron material 304 is then released upward by a static ram 308.

Figure 5C:
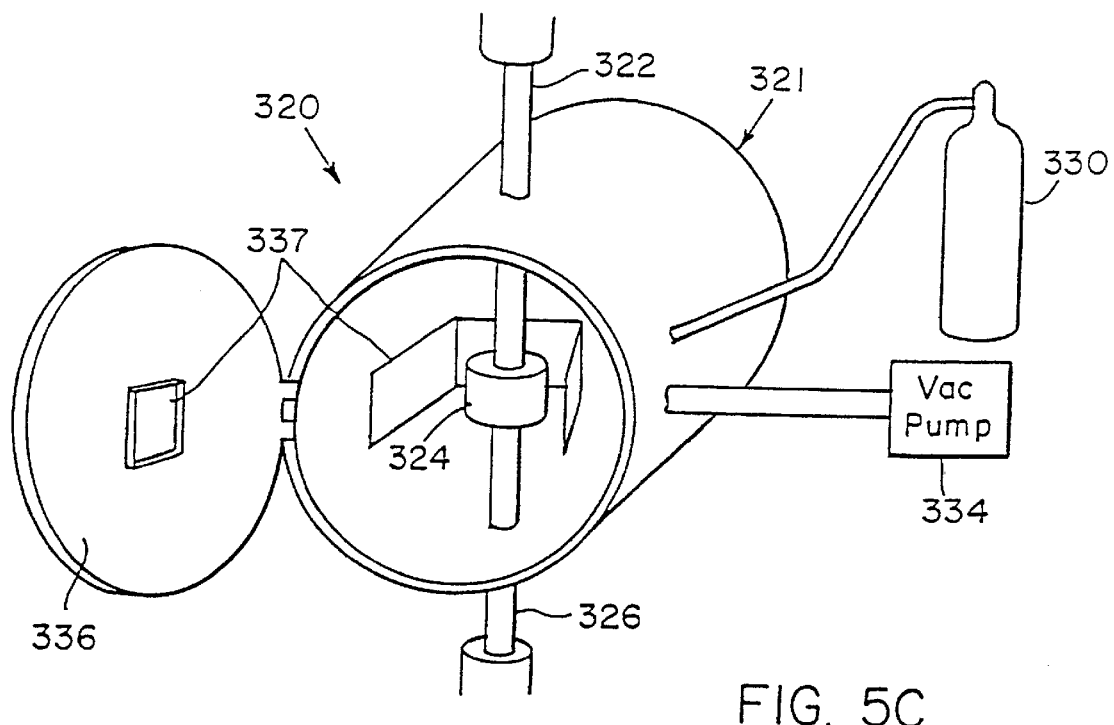
FIG. 5C graphically illustrates a preferred apparatus for conducting hot press under vacuum.
Figure 5D:
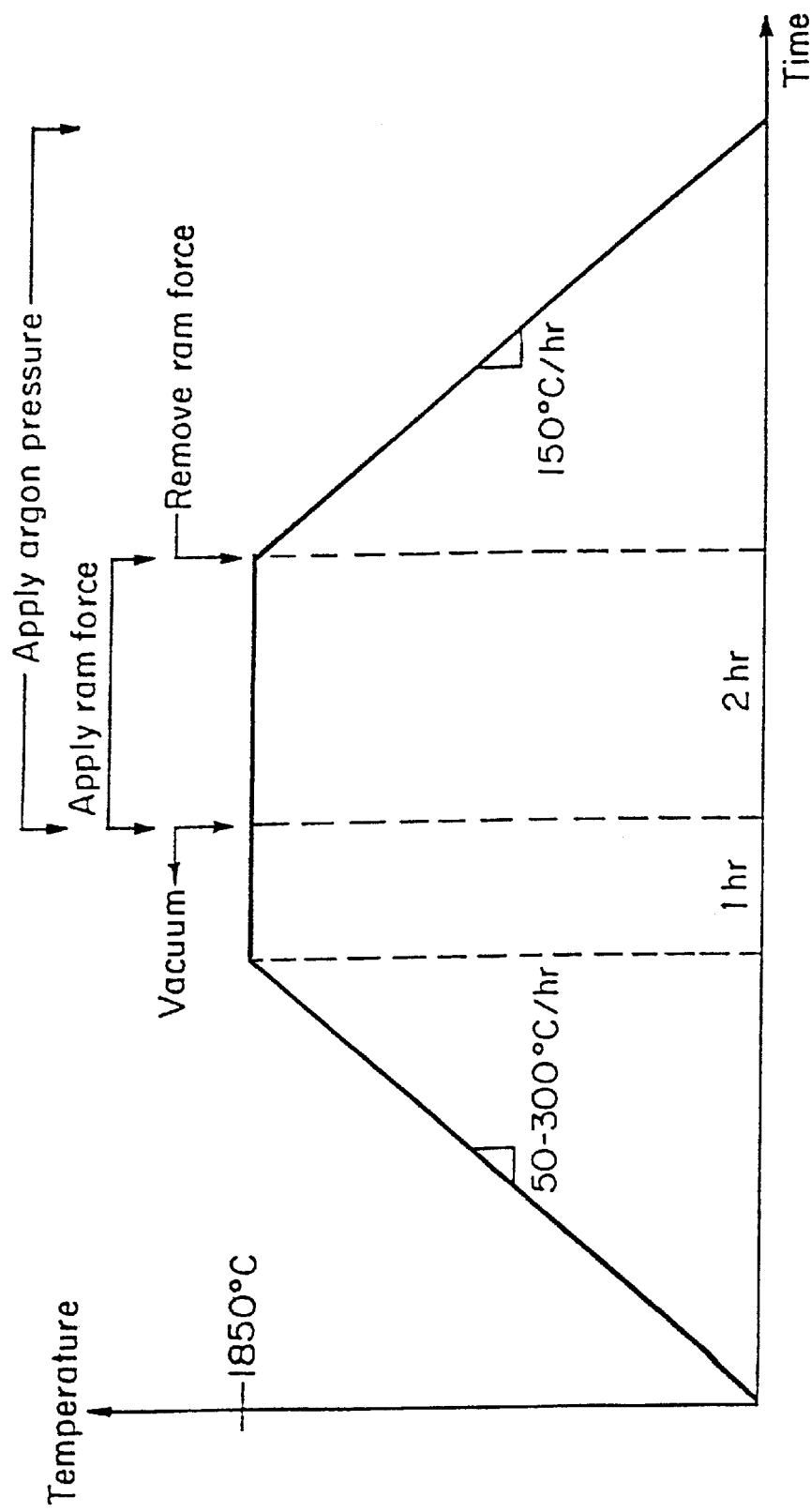
FIG. 5D is a graphical representation of a process for making a boron structure in accordance with the invention.

The pre-compacted boron powder from the first die is moved to a second graphite die at 206 and placed in a vacuum hot press system 320 (FIG. 5C). The second die 324 is lined with tantalum foil 310 of about 0.005 to 0.02 inches of thickness and boron nitride powder 312 is laid between the tantalum foil and the boron powder 206. The tantalum and boron nitride liners function as barriers to prevent the formation of $B_4C$. The boron material is heated at 208 under vacuum at the rate of about 50 to 300° C./hr to about 1850° C. At this temperature, pressure is applied as graphically illustrated in FIG. 5D.

The system 320 provides a cylindrical vacuum compartment 321 in which the boron material 304 in the second graphite die 324 is pressed by a ram 322 and ram 326. The compartment provides ports for receiving argon pressure gas 330 and outlet for vacuum pump 334. The compartment further features a pressure release port and a sealed door 336 with heating elements 337. The heat is applied slowly to remove any impurities in the boron material and also to effect complete transformation of boron from the amorphous to the crystalline state. At 1850° C. the material is held under vacuum for 1 hour and ram pressure of about 4000 to 6000 psi is applied at 210 over the boron material and sustained for about 2 hours. When ram pressure is applied, an argon overpressure of 300–1000 Torr is maintained for the duration of the process. At 214, the material is then allowed to cool, still under the argon atmosphere, at the rate of about 150° C./hr. At 216, the cooled and hardened block of boron is machined and polished to a desired configuration.

Figure 6:
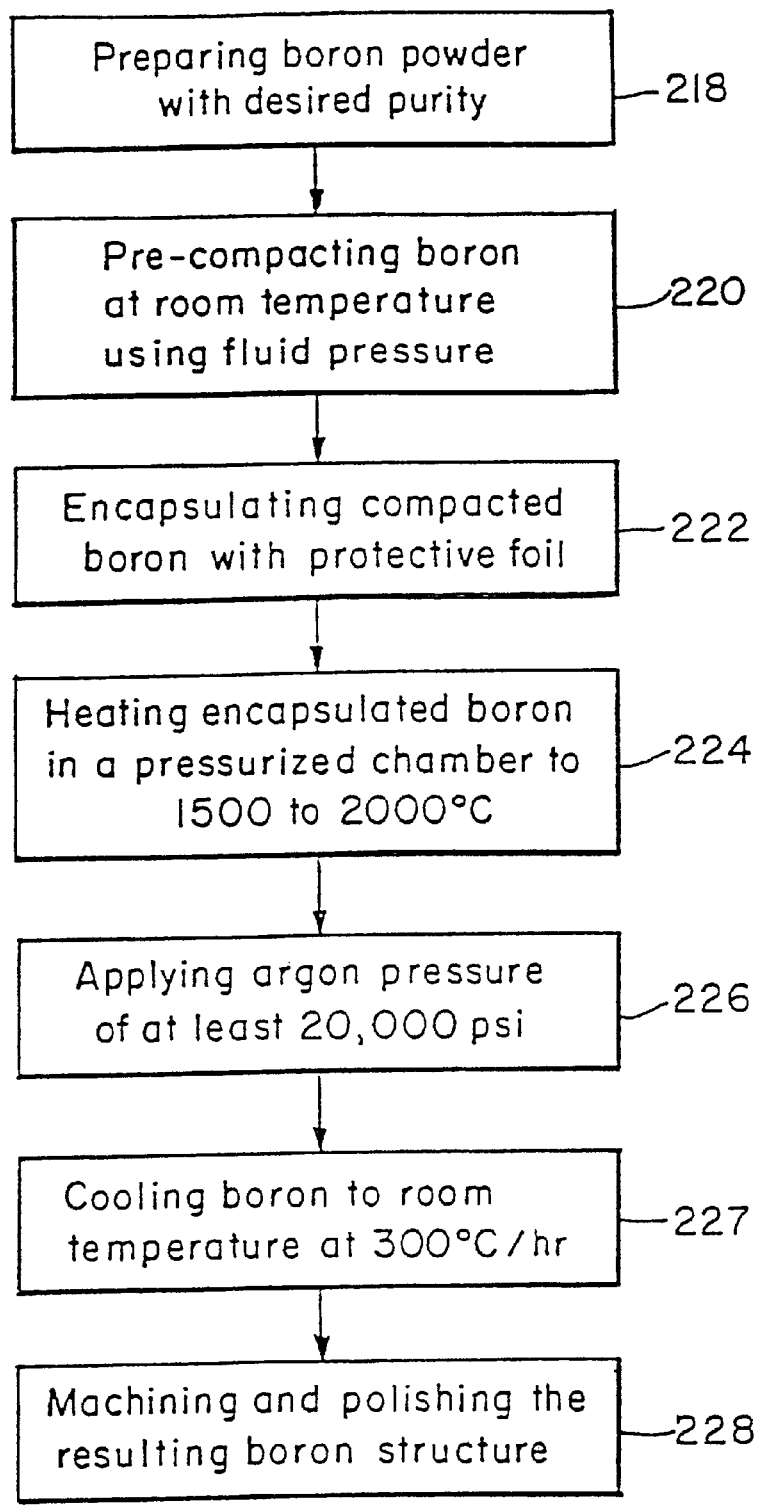
FIG. 6 is a process flow diagram illustrating steps in an isostatic pressing method for the fabrication of components in accordance with the invention.

FIG. 6 describes a preferred hot isostatic compacting method for forming dense boron material. Again, pure boron powder, preferably of 99.9% purity, is prepared at 218. The powder is typically wrapped in a flexible mold material, such as silicone rubber, and compacted at 220 at room temperature using isostatic pressure, defined as fluid pressure which provides uniform pressure from all direction. The pre-compacted boron is then encapsulated at 222 with a protective foil such as titanium, tantalum or molybdenum. The boron powder is then heated at 224 in a high pressure chamber to about 1500° C. to 2000° C. and sustained for about 1 to 3 hours. At 226, an argon pressure of at least 20000 psi is applied over the boron material. At 227, the material is allowed to cool at a controlled rate of about 300° C./hr to prevent any thermal shock to the material. At 228, the boron structure is machined and polished to a desired configuration.

Figure 7:
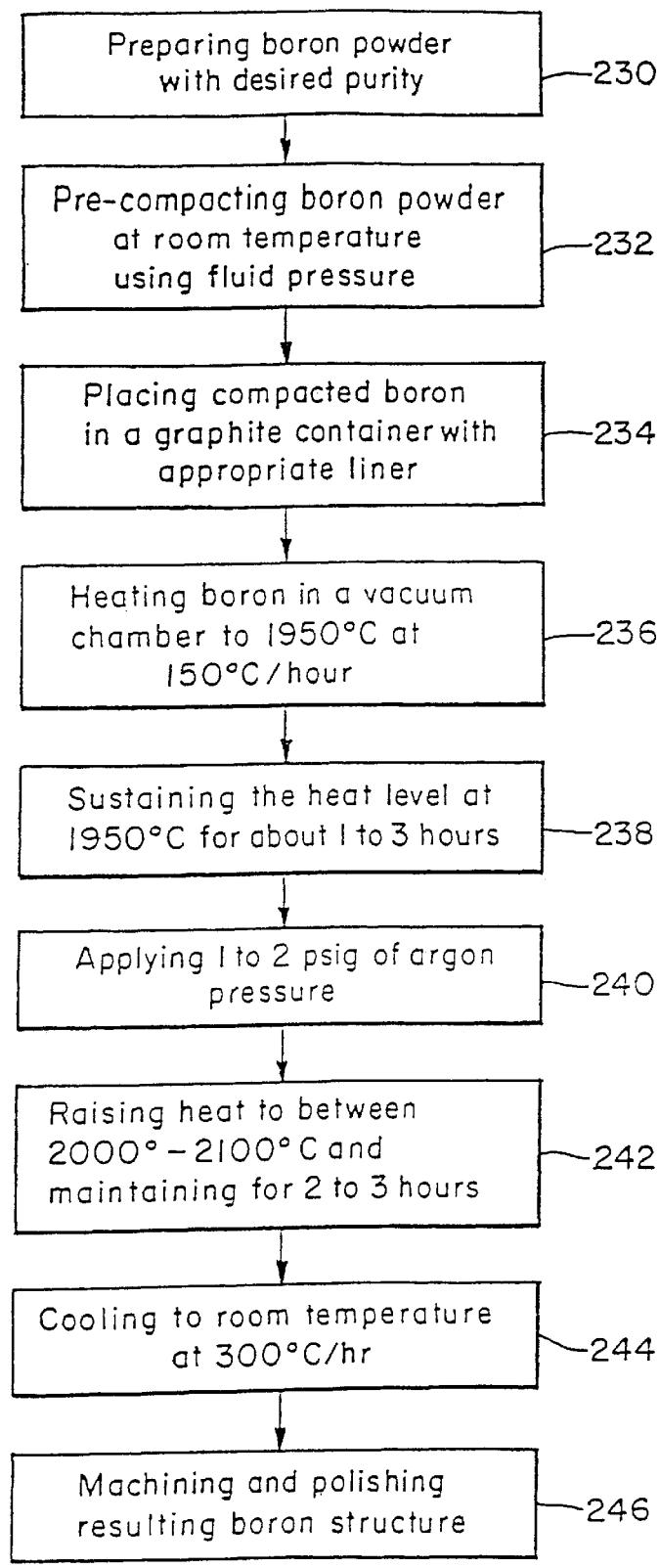
FIG. 7 is a process flow sequence illustrating the steps in a sintering method for fabricating components in accordance with the invention.

Sintering is yet another method of preparing solid boron structure and is described in FIG. 7. Here again pure boron of 99.9% purity in dry powder form is prepared at 230. The boron powder is isostatically pre-compacted at 232 using fluid pressure at room temperature, similar to the pre-compacting process described in FIG. 6. The pre-compacted boron is placed in a graphite container at 234 which is lined with tantalum foil and a layer of boron nitride powder. At 236, the container is placed in a vacuum furnace and heated to about 1950° under vacuum at the rate of 150° C./hr to about 400° C./hr. At 238 to 240, while the heat is maintained at this level for about 2 to 3 hours, 1 to 2 psig of argon pressure is applied. At 242, the heat level is raised slowly to about 2000–2100° C. and maintained for about 1 to 3 hours, still under pressure. At 244, again boron is allowed to cool at a controlled rate of about 300° C./hr to prevent any thermal shock to the material. At 246, the resulting boron structure is machined and polished to a desired configuration.

Figure 8:
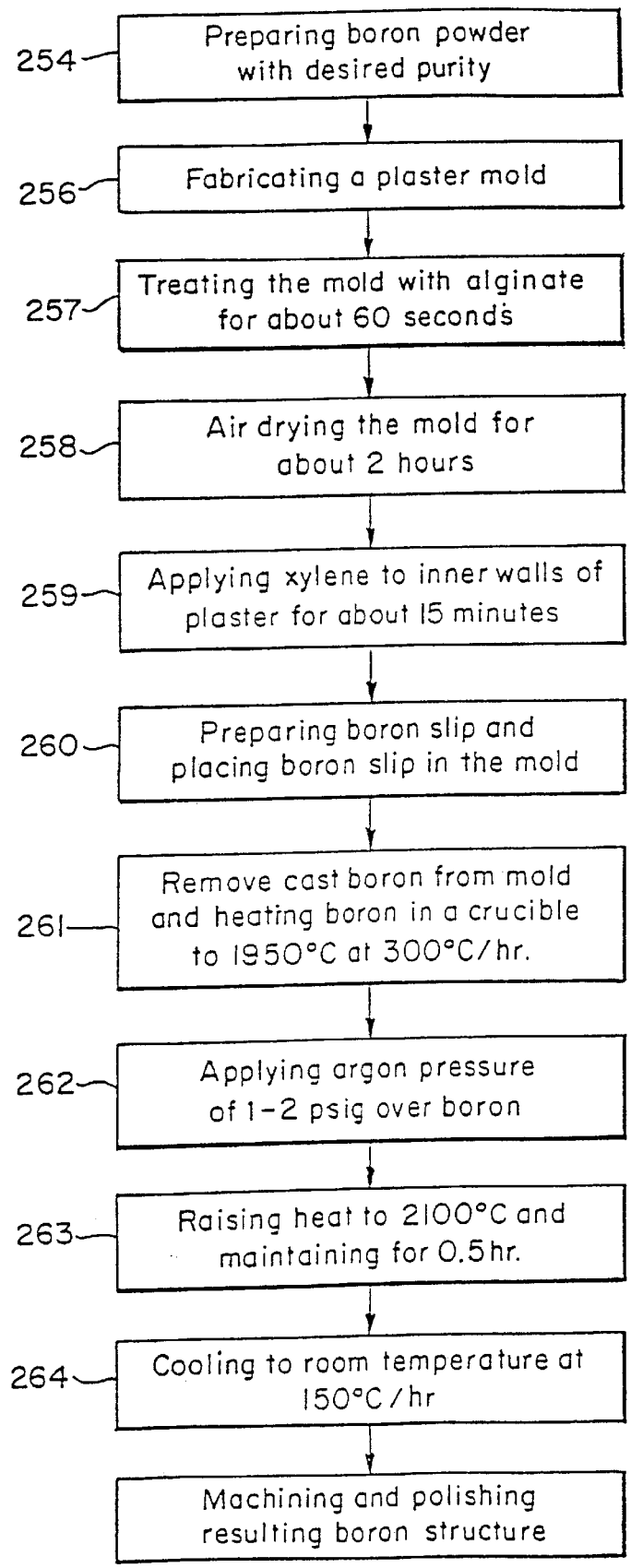
FIG. 8 is a process flow sequence illustrating the steps in a casting method for fabricating components in accordance with the invention.

FIG. 8 describes the method of melting to form solid boron. Again, at 254 a suitable boron powder is provided. A xylene fluid is added to the powder and the mixture is ball milled to achieve a slip of desired consistency. A plaster mold is fabricated at 256 to hold the boron slip in a desired shape. Prior to placing the boron powder, the mold is treated with alginate for about 60 seconds and drained at 257. At 258, the mold is air-dried for about 2 hours before being treated with xylene for about 15 minutes at 259. The boron slip is then placed in the mold for casting at 260. The cast boron material is removed from the mold and at 261, the boron material is heated in a boron nitride crucible under vacuum at the rate of about 300° C./hr to about 1950° C. At 262, argon pressure of 1 to 2 psig is applied over the material. At 263, the material is further heated to about 2200° C. and held at such a heat level for about 0.5 hour. At 264, the material is allowed to cool at the rate of 150° C./hr to room temperature. The dense boron structure is then machined and polished to a desired configuration at 265.

Figure 9A:
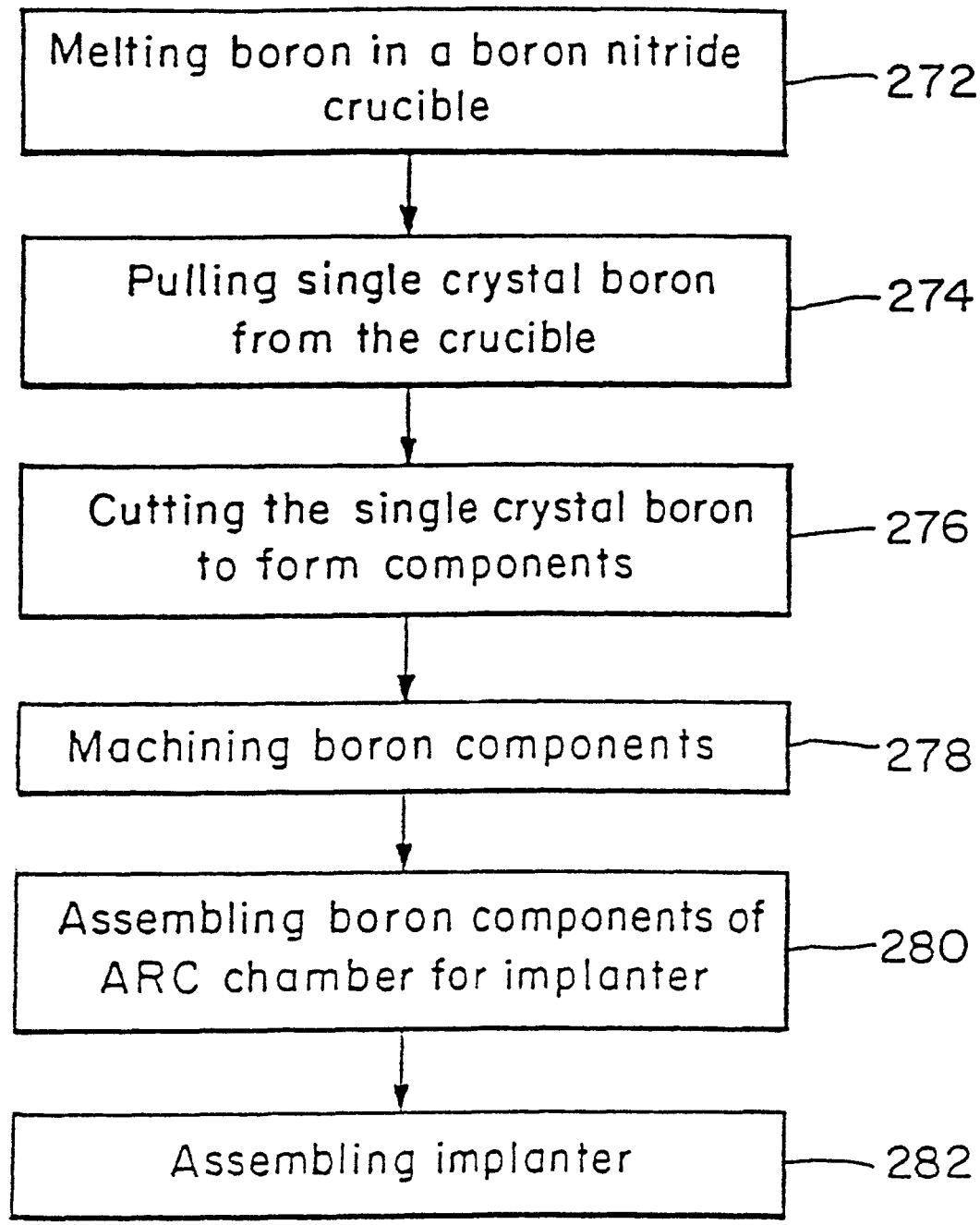
FIG. 9A is a process flow sequence illustrating a method of fabricating single crystal boron components for an ion implanter by pulling from a melt.
Figure 9B:
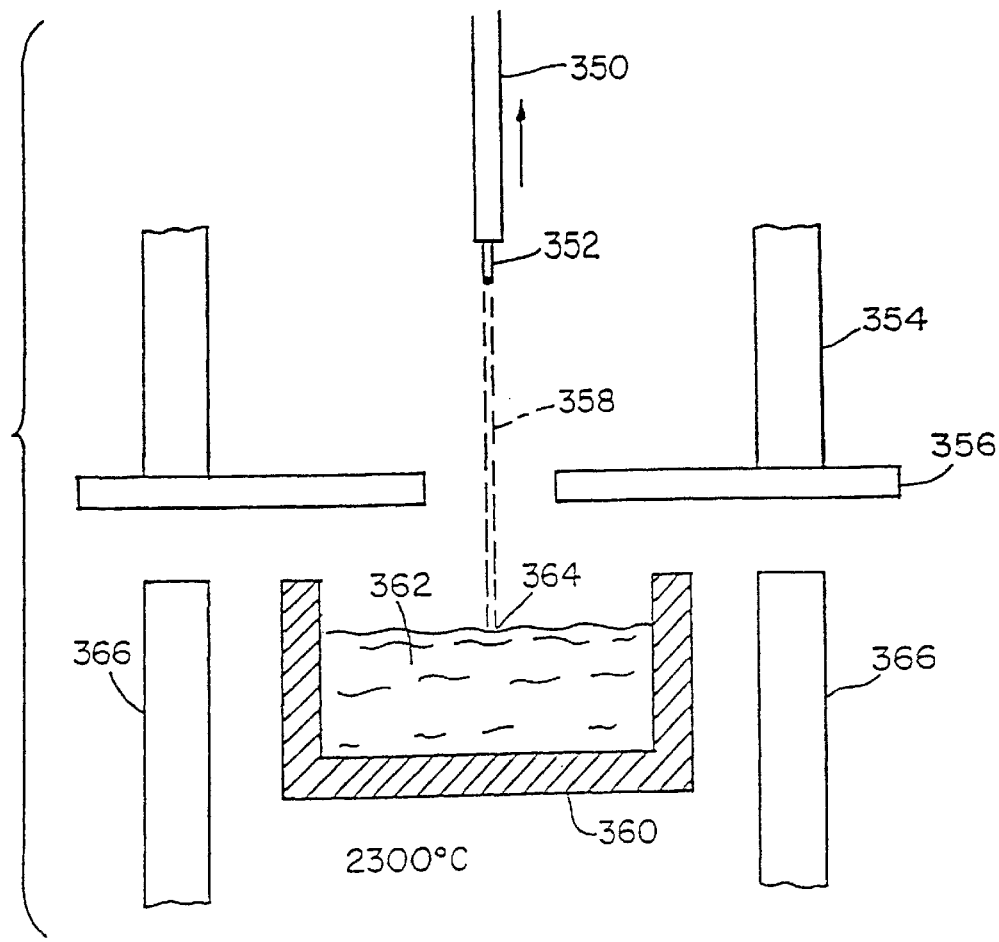
FIGS. 9B and 9C graphically illustrate the single crystal growth method.
Figure 9C:
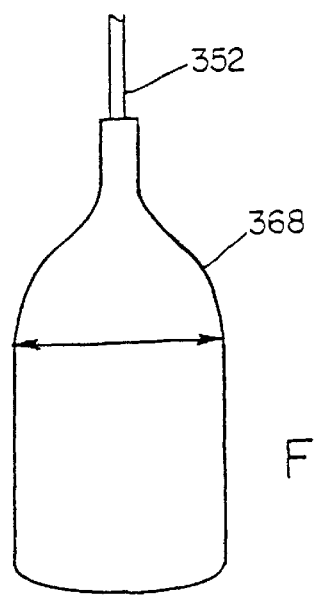

Another preferred method of making boron components for ion implantation systems utilizes a process of pulling a boule or ingot of single crystal material from a melt. This process is described in FIG. 9A and schematically illustrated in FIGS. 9B and 9C. The process includes melting boron 272 in a boron nitride crucible, pulling the single crystal material from the melt at 274 at a rate and temperature sufficient to provide a desired diameter, cutting at 276 the single crystal material to a desired shape. The parts are then machined and polished at 278 to form discrete components of an arc chamber or other components of an implanter, and then assembled at 280 and 282 as necessary.

The system for fabricating a single crystal material uses a crucible 360 in an oven 356 in which heaters 366 melt the boron powder to form a fluid 362. A rod 350 with a seed mounted on tip 352 contacts the surface at 364 and is drawn up at selected speed and temperature such that boule 368 is formed.

Single crystal boron can also be formed using known methods by deposition from the vapor phase in order to form a layer of boron on an existing part. This procedure can be used in forming filaments or in coating the internal surfaces of arc chamber or other processing chambers as described herein.

Figure 10:
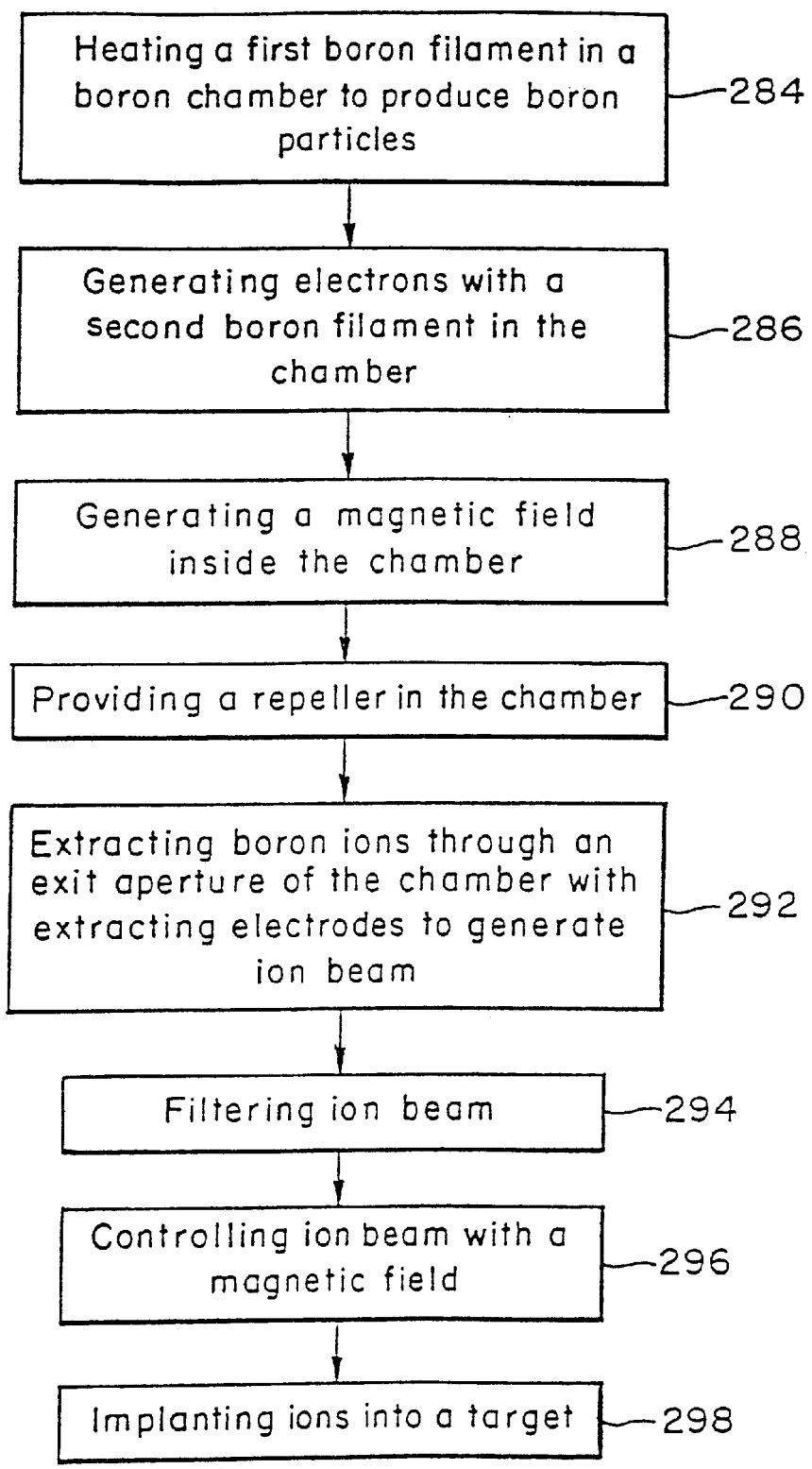
FIG. 10 illustrates a method of using an ion implanter in accordance with a preferred embodiment of the invention.

FIG. 10 describes the ion implantation process using the preferred boron materials of the present invention. A first boron filament is sufficiently heated at 284 to produce boron particles inside an ion-source chamber. A sufficient voltage is then applied at 286 to a second boron filament to generate electrons inside the chamber to react with the boron particles. A magnetic field is generated at 288 by a source to contain such electro-chemical reaction inside the chamber. A repeller of opposite charge is provided at 290 inside the chamber to further contain the ions generated by the electro-chemical reaction. The boron ions, thus formed, are extracted from the chamber by providing a sufficiently small exit aperture on the chamber and extracting electrodes near the aperture. The ion beam is then mass filtered at 294 and direction-controlled by a second magnetic field in a sealed beam path at 296. The ion beam is then directed to a target for implantation at 298.

Machining dense boron materials is generally performed using diamond tooling including core drills, milling machines and grinding wheels. Typically cutting boron material is computer numerically controlled (CNC) for precision. Other methods include lapping, electrical discharge machining, laser machining, grinding, and ultrasonic machining. Polishing dense boron materials typically utilizes a diamond grit paste.

Figure 11:
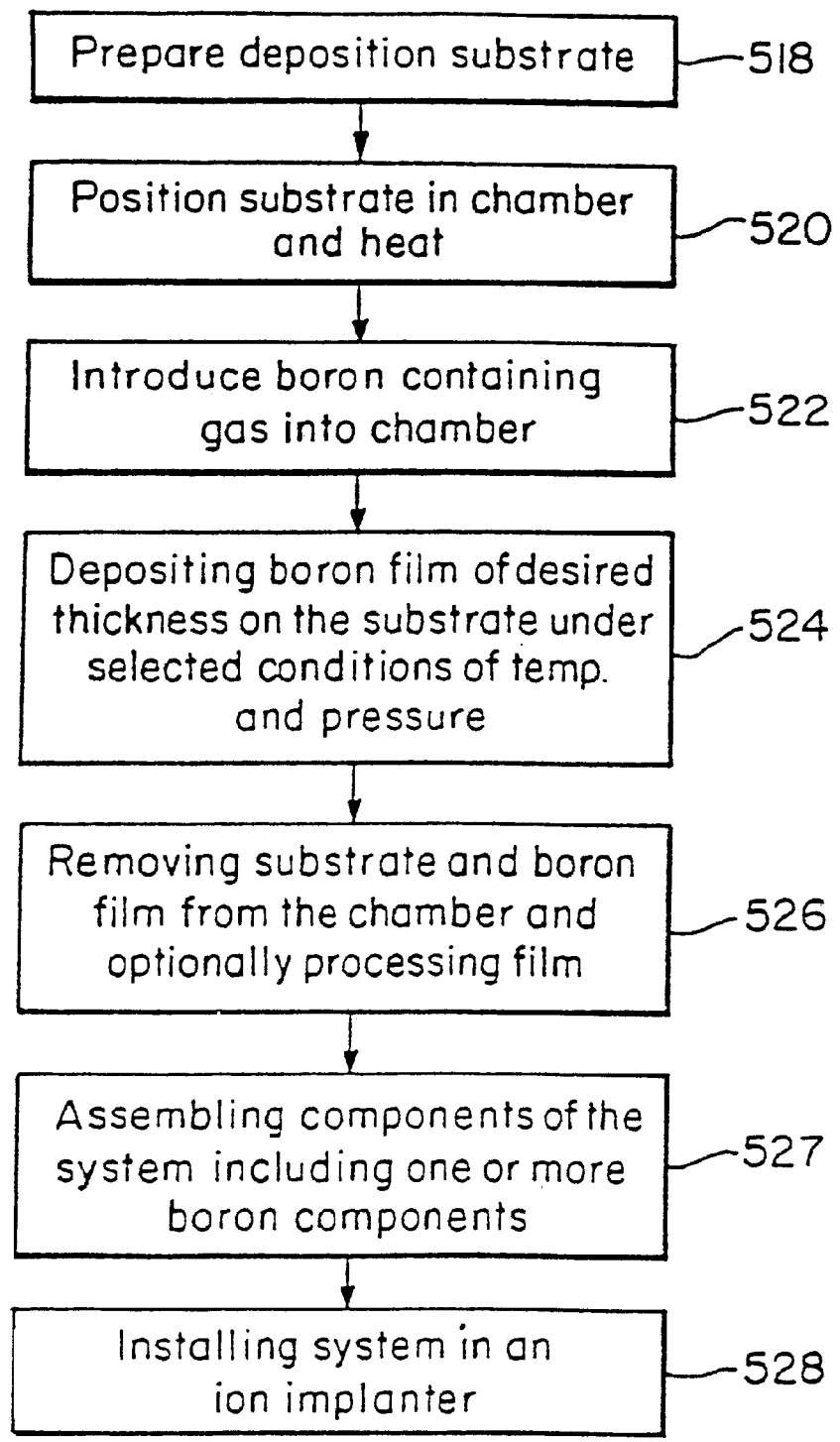
FIG. 11 is a schematic illustration of a method of fabricating boron components of a processing chamber by deposition from the vapor or gas phase.

Another preferred embodiment of a method for fabricating components for an ion implanter, including a boron ion source, is to use chemical vapor deposition (CVD) of boron on a substrate. In this technique, a boron containing gas is caused to precipitate elemental boron, either by reaction with another gas or by thermal decomposition, onto a suitably prepared substrate. The process is schematically illustrated in the process sequence of FIG. 11.

The first step is to prepare a substrate 518 of high density such as a small grained graphite or other material, preferably with a coefficient of thermal expansion approximating that of boron. The substrate can also be boron nitride, aluminum oxide, molybdenum, tungsten, tin, silicon carbide or other materials that can be machined so that when a deposit of boron has been made on its surfaces, it is the desired dimension.

A standard CVD reactor is configured so that the substrate can be heated 520 in the presence of the boron containing gas. Heating methods can be resistive heating, induction heating, or infrared heating. Following proper preparation, positioning and heating of the substrate a boron containing gas such as boron trichloride or diborane is introduced 522 to the reactor and boron is caused to deposit 524 onto the hot substrate by, for example, reaction of the boron trichloride with hydrogen, or alternatively, by thermal decomposition of the diborane.

The deposition temperature at which the boron is deposited is preferably held below about 1500° C. so that the material remains in the amorphous state rather than the crystalline state. Applications in which crystalline materials are subjected to large thermal and/or mechanical stresses can also result in fracture of these materials along weaker planes within the material. This problem is eliminated by the use of deposited amorphous boron films. The temperature is also preferably held above the maximum operating temperature of the component such as an ion source to provide the desired thermal stability in the resulting film. Thermal deposition from diborone can be conducted at about 900° C. Note that for applications requiring the use of conductive boron films, it can remain advantageous to use polycrystalline boron to improve conductivity. Both amorphous and polycrystalline films can also be doped to enhance conductivity. Dopants such as silicon or carbon can be diffused or implanted during or after boron film deposition.

In one example, a plate of graphite having a coefficient of thermal expansion of 8.2 m/m/° K was fitted with two electrode clamps so that a current could be run through it for resistive heating. The plate and electrodes were then placed in a reactor tube fitted with end flanges so that it could be evacuated and then filled with flowing gases at regulated flow rates. An infrared transducer was aimed at the surface of the plate for providing feedback to a temperature controller/power supply circuit. When the graphite reached a temperature of 1240° C., the boron trichloride and hydrogen gases were introduced in the ratio of 2 moles boron trichloride to 3 moles of hydrogen. After one half hours of operation, a uniformly thick layer measuring 0.5 mm had been deposited on the graphite plate. For preferred embodiments, it is desirable to deposit films having a thickness in the range of 0.5–3 mm.

The substrate and boron film is then removed 526 from the chamber. Depending upon the particular application or component the film can optionally be further processed by one or more methods including grinding or machining of one or more surfaces or regions of the film or the substrate to achieve desired tolerances. The film can also be separated or cleaved from the substrate.

After any optional processing one or more of the components of the processing chamber can be assembled 527 and installed in the ion implanter or other device.

Figure 12A:
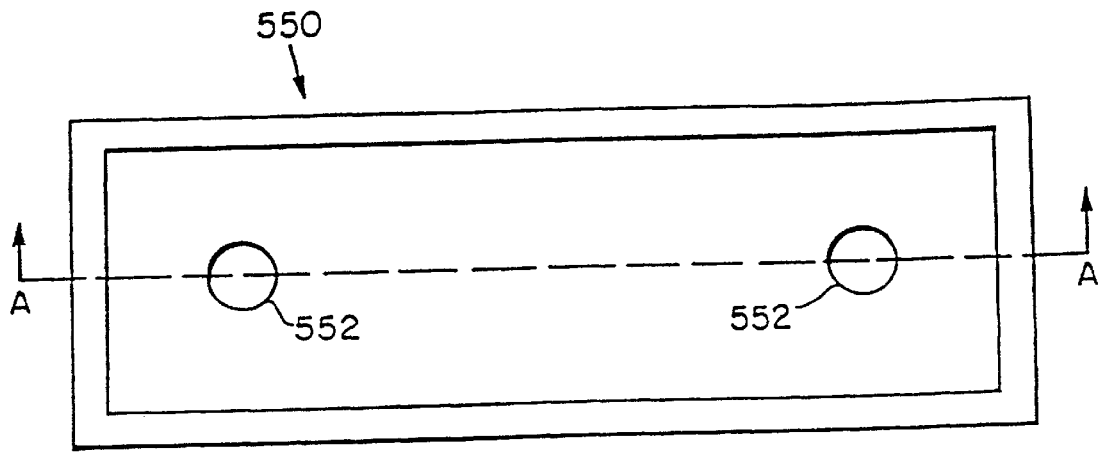
FIGS. 12A and 12B are top and cross sectional views, respectively, of an ion source housing fabricated in accordance with a preferred embodiment of the invention.
Figure 12B:
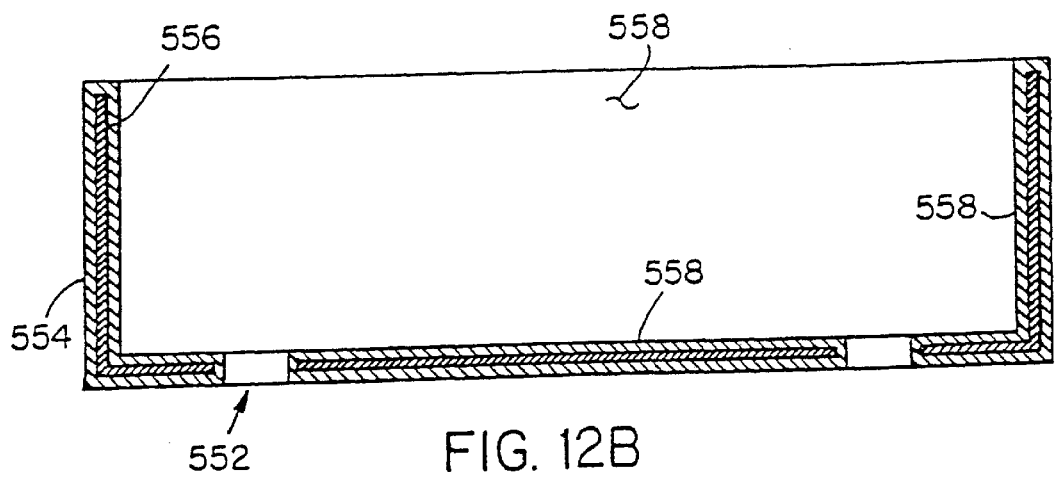

Illustrated in FIGS. 12A and 12B are top and cross-sectional views, respectively, of an ion source housing 550 fabricated in accordance with a preferred embodiment of the invention. The chamber 550 is similar in dimensions to that illustrated in connection with FIG. 2A, however, as shown along section A—A in FIG. 12B, the chamber includes an inner shell or substrate 556 on which a thin film of boron 554 has been deposited. Deposition can be used to uniformly coat the entire surface including ports 552, or alternatively, can cover all or selected portions of internal surfaces 558.

Figure 13A:
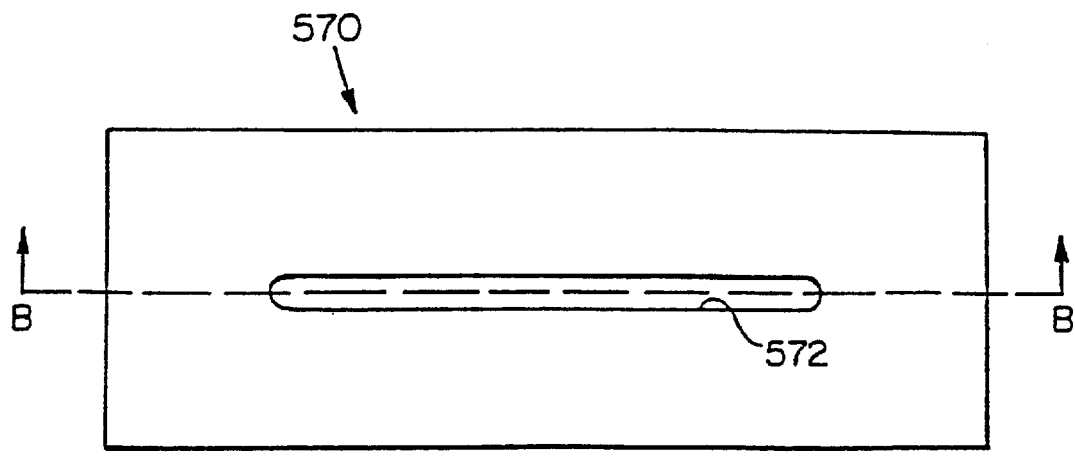
FIGS. 13A and 13B illustrate top and cross-sectional views, respectively, of a portion of an ion source housing fabricated in accordance with a preferred embodiment of the invention.
Figure 13B:
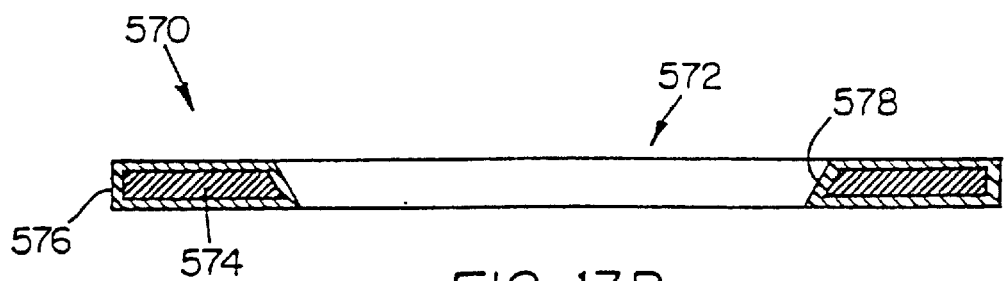

Shown in the top and cross-sectional views of FIGS. 13A and 13B, respectively, is the top 570 of the chamber 550. The aperture 572 can have a beveled shape at 578, as seen in the section B—B of FIG. 13B. A thin film of boron 576 has been deposited on substrate 574 to provide the ion source aperture.

Figure 14:
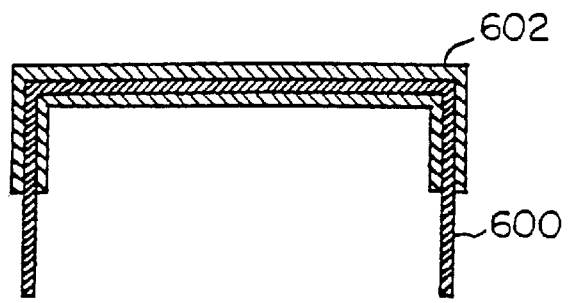
FIG. 14 is a cross-sectional view of a boron deposited electrode fabricated in accordance with the invention.

In another preferred embodiment, the deposition process can be used in the fabrication of other components described previously herein. For example, a filament or wire used in the ion source can be coated with a thin film of boron to provide an electrode or boron source for use in the ion source housing. Such a film is shown in the cross-sectional view of FIG. 14 in which a metal filament 600 has a thin film 602 of boron thereon.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An ion source comprising:
   a gaseous boron source attached to an arc chamber, the gaseous boron source providing boron ions within the arc chamber, the arc chamber including a boron housing element having an aperture such that a beam of ions can be directed through the aperture, a cathode within the boron housing element that provides electrons, the boron housing element comprising a boron material with a density in a range between 80% and 100% of a maximum density of pure boron.

2. The ion source of claim 1 wherein the boron housing element further comprises a rectangular arc chamber in which the ion source is positioned.

3. The ion source of claim 1 further comprising a vacuum port.

4. The ion source of claim 1 wherein the arc chamber further comprises a fluid inlet port.

5. A method of generating ions comprising the steps of:
   providing an ion source including a gaseous boron material that is introduced into a boron arc chamber, the boron arc chamber comprising a boron material with a density in a range between 80% and 100% of a maximum density of pure boron;
   generating a beam of ions within the boron arc chamber; and
   directing the beam of ions along a beam path with an electric field through an aperture in the chamber.

6. The method of claim 5 further comprising providing a boron material having an atomic percentage of elemental boron of at least 95%.

7. The method of claim 5 further comprising heating a boron electrode in the chamber to conduct a current through the boron electrode.

8. The method of claim 7 further comprising conducting a current of at least 1 amp through the boron material.

9. An ion source comprising:
   a gaseous boron source attached to an arc chamber, the gaseous boron source providing boron ions within the arc chamber, the arc chamber including a boron housing element and an aperture such that a beam of ions can be directed through the aperture, a cathode within the boron housing element that provides electrons, the boron housing element comprising an amorphous material with a density in a range between 80% and 100% of a maximum density of pure boron.

10. The ion source of claim 9 wherein the boron housing element further comprises a rectangular arc chamber in which the ion source is positioned.

11. The ion source of claim 9 further comprising a vacuum port.

12. The ion source of claim 9 wherein the arc chamber further comprises a fluid inlet port.

13. The ion source of claim 9 wherein said boron housing element comprises a boron material having an atomic percentage of elemental boron of at least 95%.

14. The ion source of claim 9 further comprising means for heating a boron electrode in the chamber to conduct a current through the boron electrode.

15. The ion source of claim 14 further comprising a power supply that delivers a current of at least 1 amp through the boron material.

16. The ion source of claim 9 wherein the boron housing element comprises a composite structure including a layer of the amorphous boron material on a substrate.

* * * * *